United States Patent
Park (10) Patent No.: US 8,456,585 B2
(45) Date of Patent: Jun. 4, 2013

(54) FABRICATION METHOD OF LIQUID CRYSTAL DISPLAY DEVICE HAVING DRIVING CIRCUIT-INTEGRATED ARRAY SUBSTRATE

(75) Inventor: Yong In Park, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 1017 days.

(21) Appl. No.: 11/302,401

(22) Filed: Dec. 14, 2005

(65) Prior Publication Data

US 2006/0139506 A1 Jun. 29, 2006

(30) Foreign Application Priority Data

Dec. 23, 2004 (KR) .................. 10-2004-0111498

(51) Int. Cl.
*G02F 1/136* (2006.01)
*G02F 1/13* (2006.01)

(52) U.S. Cl.
USPC ............................. 349/47; 349/43; 349/187

(58) Field of Classification Search
USPC ............................................. 349/43, 47, 187
See application file for complete search history.

(56) References Cited

U.S. PATENT DOCUMENTS

| 2003/0038289 A1* | 2/2003 | Yamazaki et al. | 257/72 |
| 2003/0122132 A1* | 7/2003 | Yamazaki | 257/72 |
| 2004/0051142 A1* | 3/2004 | Yamazaki et al. | 257/347 |

* cited by examiner

*Primary Examiner* — Lauren Nguyen
(74) *Attorney, Agent, or Firm* — McKenna Long & Aldridge LLP (57) ABSTRACT

A method of fabricating a liquid crystal display device includes providing a first substrate having a first region and a second region; forming an active pattern in the first and second regions of the first substrate; forming a first insulation film on the first substrate; forming a first gate electrode with a low-resistance conductive material on an upper portion of the active pattern; forming a second gate electrode to completely cover the first gate electrode on an exposed portion of the first gate electrode; forming N type source and drain regions in the active pattern of the first region by doping an n+ impurity ion; forming P type source and drain regions in the active pattern of the second region by doping a p+ impurity ion; forming a second insulation film on the first substrate; forming N type source and drain electrodes electrically connected with the N type source and drain regions on the first region and forming P type source and drain electrodes electrically connected with the P type source and drain regions on the second region; and attaching the first and second substrates. A low-resistance wiring can be implemented on a large-scale liquid crystal display panel by forming a second gate wiring of a clad structure at an upper portion of a low-resistance first gate wiring.

12 Claims, 5 Drawing Sheets

FABRICATION METHOD OF LIQUID CRYSTAL DISPLAY DEVICE HAVING DRIVING CIRCUIT-INTEGRATED ARRAY SUBSTRATE

This application claims the benefit of Korean Patent Application No. 10-2004-0111498, filed on Dec. 23, 2004, which is hereby incorporated by reference for all purposes as if fully set forth herein.

BACKGROUND OF THE INVENTION

1. Field of the Invention

The present invention relates to a liquid crystal display (LCD) device and, more particularly, to a driving circuit-integrated LCD device with a large-scale panel and a fabrication method capable of fabricating a large-scale panel by implementing a low-resistance wiring.

2. Discussion of the Related Art

In today's information society the importance display of devices to present visual information is increasing, and in order to be successful in the marketplace, the display device must have low power consumption, thin profile, low weight, and high picture quality characteristics. A liquid crystal display (LCD), an important type of a flat panel display (FPD), can satisfy these conditions as well as being suitable for mass production, so various types of brand-new products have been introduced taking advantage of LCDs. Also LCDs are replacing cathode ray tubes (CRTs) in many applications.

In general, LCD devices display a desired image by controlling the light transmittance of liquid crystal cells by separately supplying a data signal carrying image information to the liquid crystal cells arranged in a matrix form.

Active matrix (AM) LCDs have liquid crystal in pixel areas that are driven using an amorphous silicon thin film transistor (a-Si TFT) as a switching device.

The concept of the amorphous silicon TFT technique was established by LeComber et al. of England in 1979 and commercialized as a 3-inch liquid crystal mobile TV. Recently, 50-inch or wider large-scale TFT LCD devices have been developed. In particular, because the amorphous silicon TFT is available as a low temperature process and can use an inexpensive substrate, it is widely used.

However, the electrical mobility of the amorphous silicon TFT cannot support a peripheral circuit requiring a high switching speed of 1 MHz or higher. Thus, research to integrate both the pixel part and the driving circuit part on a glass substrate by using polycrystalline silicon that has greater field effect mobility than the amorphous silicon TFT is being actively pursued.

Polycrystalline silicon TFTs have been used in small modules such as in camcorders since the liquid crystal color television was developed in 1982, because with its low photosensitivity and high field effect mobility, a driving circuit can be directly fabricated on the substrate.

The increase in mobility can enhance the operation frequency of the driving circuit that determines the number of pixels, and thus the image resolution of the display device can be facilitated. In addition, because time for charging a signal voltage of the pixel part is reduced, distortion of a transmission signal is reduced and thus the picture quality can be improved.

Further, the polycrystailine silicon TFT can be driven at a voltage lower than 10V compared with the amorphous silicon TFT having a high driving voltage (~25V). Power consumption may also be reduced.

The structure of the LCD device will now be described with reference to FIG. 1.

Figure 1:
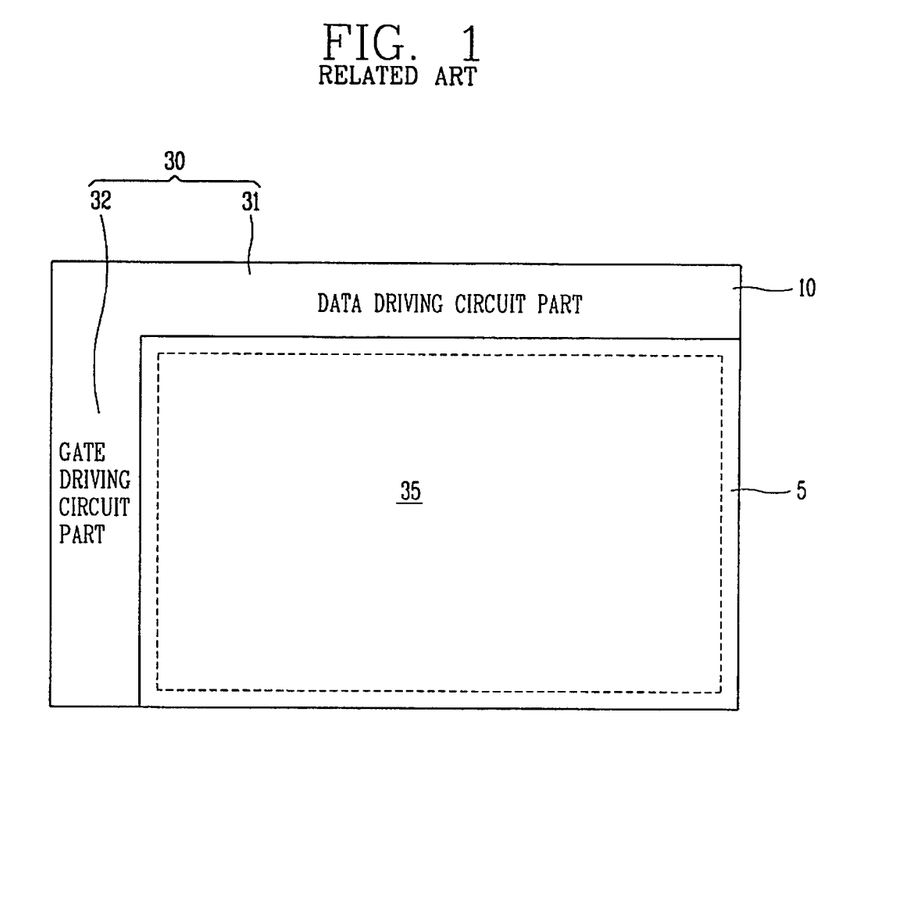
FIG. 1 is a plan view showing an exemplary structure of a related art driving circuit-integrated liquid crystal display device.

FIG. 1 is a schematic plan view showing the structure of a related art LCD device, specifically, a driving circuit-integrated LCD device in which a driving circuit is integrated on an array substrate.

As shown, the LCD device includes a color filer substrate 5, an array substrate 10 and a liquid crystal layer (not shown) formed between the color filter substrate 5 and the array substrate 10.

The array substrate 10 comprises a pixel area 35, an image display region in which pixels are arranged in a matrix form, and a driving circuit 30 including a data driving circuit 31 and a gate driving circuit 32 positioned at the periphery of the pixel area 35.

Though not shown, the pixel area 35 includes a plurality of gate lines and a plurality of data lines vertically and horizontally arranged to define a plurality of pixel regions on the substrate 10, a TFT, a switching device, formed at each crossing of the gate lines and the data lines, and a pixel electrode formed in the pixel region.

The TFT, a switching device for applying or cutting off a signal voltage to the pixel electrode, may be a field effect transistor (FET) controlling the flow of a current by a field effect.

The driving circuit 30 area of the array substrate 10 extends beyond the color substrate 5 and is positioned at an outer edge of the pixel area 35 of the array substrate 10. In this case, the data driving circuit 31 is positioned at the longer side of the extended array substrate 10 and the gate driving circuit 32 is positioned at the shorter side of the extended array substrate 10.

In order to suitably output an input signal, the data driving circuit 31 and the gate driving circuit 32 use a TFT with a CMOS (Complementary Metal Oxide Semiconductor) structure, namely, an inverter.

For reference, a CMOS TFT is an integrated circuit having a MOS structure used for the driving circuit TFT that requires high speed signal processing, needs an N channel TFT and a P channel TFT, and has speed and density characteristics in between an NMOS and a PMOS.

The gate driving circuit 32 and the data driving circuit 31 supply a scan signal and a data signal to the pixel electrode through the gate lines and the data lines. Connected with an external signal input terminal (not shown), the gate driving circuit 32 and the data driving circuit 31 control an external signal input through the external signal input terminal and output it to the pixel electrode.

A color filter (not shown) that implements color and a common electrode (not shown) that is opposite the pixel electrode formed on the array substrate 10, are formed in the pixel area 35 of the color filter substrate 5.

A cell gap is prepared between the color filter substrate 5 and the array substrate 10, allowing the substrates to be uniformly separated by spacers (not shown), and the two substrates are attached by a seal pattern (not shown) formed at an outer edge of the pixel area 35 to thereby form a liquid crystal display panel. At this time, the two substrates 5 and 10 are attached to one another using an attachment key formed on the color filter substrate 5 or the array substrate 10.

Because the constructed driving circuit integrated LCD device uses the polycrystalline silicon TFT, it has excellent device characteristics including excellent image quality and fineness, and it consumes less power.

However, the driving circuit-integrated LCD device has disadvantages in that because the N type TFT and the P type TFT are formed together on the same substrate, its fabrication process is quite complicated compared with the amorphous silicon TFT LCD device in which only a single type channel is formed.

Meanwhile, the gate wiring and the data wiring are means for transferring a scan signal and a data signal, respectively, and in this case, a signal delay and disconnection need to be avoided.

Thus, a material used for the wirings must have a specific resistance below a certain level, resist oxidation, and prevent disconnects during the fabrication process.

However, the related art LCD has a problem in implementing a large-scale liquid crystal display panel that requires a low-resistance wiring.

SUMMARY OF THE INVENTION

Accordingly, the present invention is directed to liquid crystal display device and fabrication method thereof that substantially obviates one or more of the problems due to limitations and disadvantages of the related art.

An advantage of the present invention is to provide a liquid crystal display (LCD) device implementing a low-resistance wiring on a large-scale liquid crystal display panel by forming a second gate wiring with a clad structure at an upper portion of a low-resistance first gate wiring, and its fabrication method.

Another advantage of the present invention is to provide a driving circuit-integrated liquid crystal display (LCD) device integrating a driving circuit including a polycrystalline silicon thin film transistor (TFT) on a large-scale liquid crystal display panel on which a low-resistance wiring is implemented, and its fabrication method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method of fabricating a liquid crystal display device including: providing a first substrate having a first region and a second region; forming an active pattern in the first and second regions of the first substrate; forming a first insulation film on the first substrate; forming a first gate electrode with a low-resistance conductive material on an upper portion of the active pattern; forming a second gate electrode to completely cover the first gate electrode on an exposed portion of the first gate electrode; forming N type source and drain regions in the active pattern of the first region by doping an n+ impurity ion; forming P type source and drain regions in the active pattern of the second region by doping a p+ impurity ion; forming a second insulation film on the first substrate; forming N type source and drain electrodes electrically connected with the N type source and drain regions on the first region and forming P type source and drain electrodes electrically connected with the P type source and drain regions on the second region; and attaching the first and second substrates.

To achieve the objects, there is also provided a method of fabricating a liquid crystal display device including: providing a first substrate including a pixel portion and a driving circuit portion having first and second regions; forming an active pattern on the pixel portion and the driving circuit portion of the first substrate; forming a first insulation film on the first substrate; forming a first gate electrode with a low-resistance conductive material on an upper portion of an active pattern; forming a second electrode to completely cover the first gate electrode on an exposed portion of the first gate electrode; forming N type source and drain regions in the pixel portion and the active pattern of the first region of the driving circuit portion by doping an n+ impurity ion; forming P type source and drain regions in the active pattern of the second region of the driving circuit portion by doping a p+ type impurity ion; forming a second insulation film on the first substrate; forming N type source and drain electrodes electrically connected with the N type source and drain regions at the pixel portion and the first region of the driving circuit portion and forming P type source and drain electrodes electrically connected with the P type source and drain regions at the second region of the driving circuit portion; and attaching the first substrate and a second substrate.

To achieve the objects, there is also provided a liquid crystal display device including: a first substrate having first and second regions; an N type thin film transistor formed at the first region of the first substrate and including a gate electrode having a first gate electrode formed of a low-resistance conductive material and a second gate electrode formed to completely cover the first gate electrode, an N type active pattern, and source and drain electrodes; and a P type thin film transistor on the same layer of the second region corresponding to the gate electrode, the active pattern and the source and drain electrodes of the first region and including a gate electrode having a first gate electrode formed of the low-resistance conductive material and a second gate electrode formed to cover the first gate electrode at an upper portion thereto, a P type active pattern and source and drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

The liquid crystal display (LCD) device and its fabrication method in accordance with the present invention will now be described in detail with reference to the accompanying drawings.

FIGS. 2A to 2G are sequential sectional views showing a fabrication process of a thin film transistor (TFT) in accordance with a first embodiment of the present invention.

In general, an N type TFT or a P type TFT is used as a switching device of a pixel while a CMOS device comprising both the N type TFT and the P type TFT is used as a driving device of a driving circuit. The drawings show a method for simultaneously fabricating the N type TFT and the P type TFT.

Specifically, a method for fabricating the N type TFT is shown at the left side on the drawing and a method for fabricating the P type TFT is shown at the right side on the drawing.

Figure 2A:
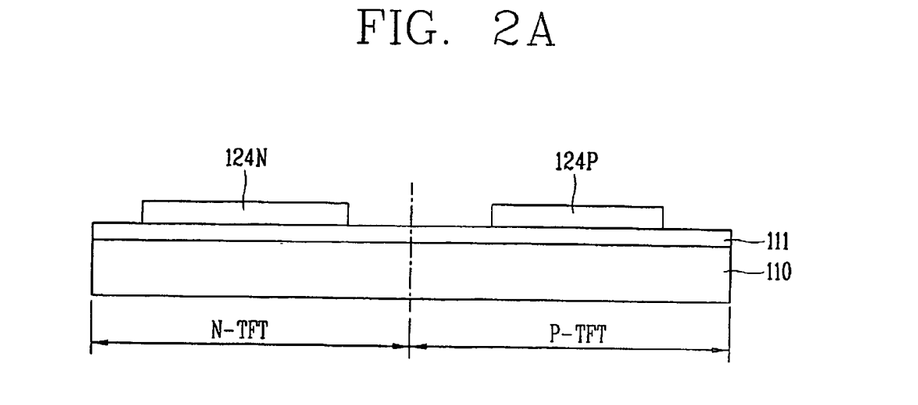
FIGS. 2A to 2G are sequential sectional views showing a fabrication process of a thin film transistor (TFT) in accordance with a first embodiment of the present invention.

As shown in FIG. 2A, a buffer layer 111 formed of a silicon oxide film is formed on a substrate 110 made of a transparent insulation material.

The buffer layer 111 serves to prevent infiltration of an impurity such as natrium (Na) existing in the glass substrate 110 into an upper layer during a crystallization process.

Active patterns 124N and 124P formed of polycrystalline silicon are formed at the N type TFT region and the P type TFT region of the substrate 110 on which the buffer layer 111 has been formed.

In order to form the active patterns 124N and 124P, an amorphous silicon TFT is deposited on the entire surface of the substrate 110 and then crystallized by using a crystallization method such as laser annealing to form the polycrystalline silicon thin film. Thereafter, the crystallized polycrystalline silicon thin film is patterned by using a photolithography process (a first masking process) to form the active patterns 124N and 124P, respectively, on the N type TFT region and the P type TFT region.

The photolithography process forms a desired pattern by transferring a pattern formed on a mask onto the thin film-deposited substrate that includes a sensitizing solution coating process, an exposing process, and a developing process.

Methods for depositing the amorphous silicon thin film include a low pressure chemical vapor deposition (LPCVD) and plasma enhanced chemical vapor deposition (PECVD).

When the amorphous silicon thin film is deposited according to the PECVD method, the amorphous silicon thin film includes about 20% hydrogen atoms depending upon the temperature of the substrate. Thus, when the amorphous silicon thin film is deposited according to the PECVD method, a dehydrogenation process needs to be performed to discharge the hydrogen atoms in the thin film.

At this time, in order to crystallize the amorphous silicon thin film, various types of crystallization methods may be used. When employing a laser annealing method using a laser, an eximer laser annealing (ELA) method using a pulse type laser is typically used, and in this case, a sequential lateral solidification (SLS) method in which grains are grown to improve the crystallization characteristics may also be used.

The SLS method uses the fact that grains grow in a direction perpendicular to an interface of liquid phase silicon and solid phase silicon By growing grains to a certain length laterally by suitably controlling the laser energy level and laser beam irradiation range, the size of the silicon grains may be enhanced.

Figure 2B:
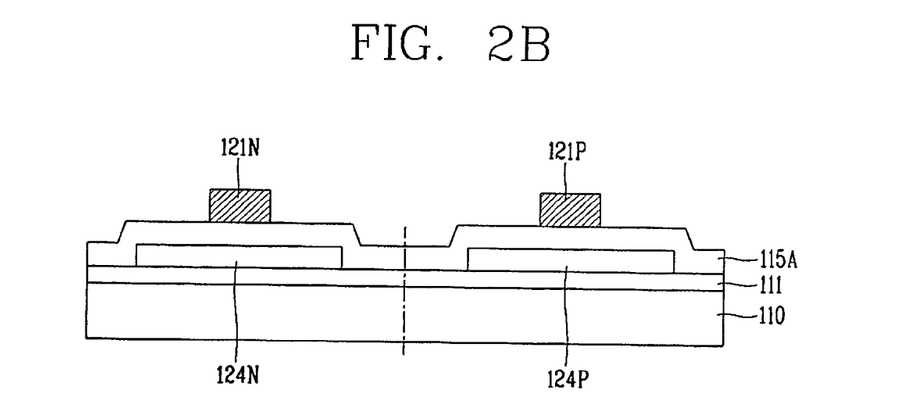

Next, as shown in FIG. 2B, a first insulation film 115A, a gate insulation film, is formed on the entire surface of the substrate 110 on which the active patterns 124N and 124P have been formed.

Thereafter, first gate electrodes 121N and 121P may be formed of a low-resistance conductive material of aluminum or an aluminum group such as aluminum-neodyminum (AlNd) or the like.

Regarding the formation of the first gate electrodes 121N and 121P, a conductive material of the aluminum group may be deposited on the entire surface of the substrate 110 on which the first insulation film 115A has been formed, and then selectively patterned through the photolithography process (the second masking process), to thereby form the first gate electrodes 121N and 121P.

In this embodiment of the present invention, in order to implement a low-resistance wiring on the array substrate 110, a low-resistance conductive material of the aluminum group may be used to form the first gate electrodes 121N and 121P, and in this case, there is a possibility that the wiring of the aluminum group may be affected and thus etched by a developer during a doping process (to be described). Thus, in order to solve such a problem, in the related art, the wiring is formed of a conductive material such as molybdenum that does not react to the developer, but because molybdenum has higher resistance than the aluminum group, it is not suitable for implementing a large-scale liquid crystal display panel.

That is, as the wiring metal of the array substrate, in order to prevent a signal delay, the low-resistance conductive material such as aluminum, an aluminum alloy, copper, a copper alloy, or the like which has a low resistance of below ~40-80×10$^{-6}$ Ωcm$^{-1}$ is suitable, and among them, aluminum or the aluminum alloy is preferably selected to be used. Herein, the aluminum alloy may contain about 5% of a transition metal such as chromium (Cr), titanium (Ti), Molybdenum (Mo), Uranium (Ur), Tantalum (Ta), Tungsten (W), or the like.

However, the low resistance conductive material of the aluminum group is disadvantageous in that it corrodes easily and causes a hillock phenomenon during the process. In particular, in the case of using a conductive material of the aluminum group for the gate wiring, aluminum is etched by the developer during the doping process as mentioned above.

Thus, because wiring with only the aluminum layer causes degradation of the device characteristics, a metal wiring with a dual structure formed by stacking molybdenum or a molybdenum alloy that does not react to the developer on the single layer of aluminum or the aluminum alloy.

However, the dual-metal layer wiring also has the following problem. When the stacked layers are collectively etched, an etch width of the upper molybdenum or molybdenum alloy is greater than that of the conductive material of the aluminum group due to a selectivity ratio of the conductive material, a portion of the conductive material of the lower aluminum group is exposed and etched by the developer.

Figure 2C:
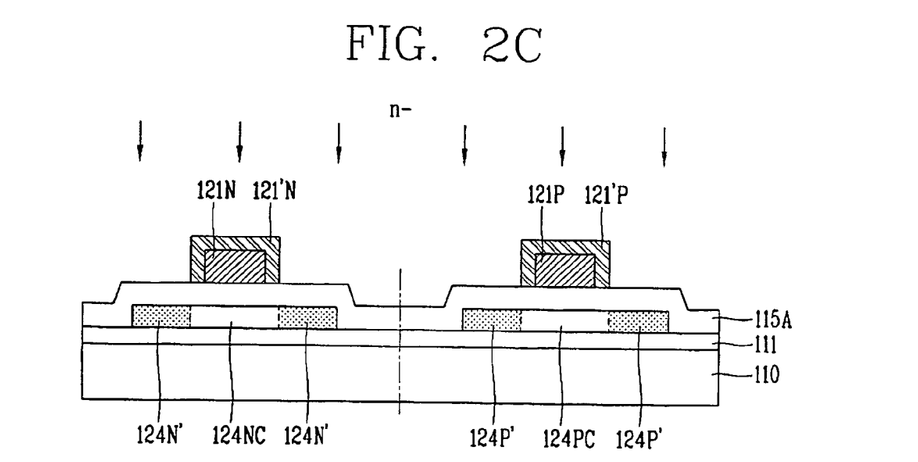

Therefore, in the present invention, in order to solve the problem, as shown in FIG. 2C, second gate electrodes 121'N and 121'P are formed in a clad structure completely covering the first gate electrodes 121N and 121P made of the low-resistance conductive material of the aluminum group.

In this case, the second gate electrodes 121'N and 121'P are formed such that a conductive material such as molybdenum, titanium, chrome or the like that does not react to the developer and has excellent contact characteristics with respect to the conductive material of the aluminum group is deposited and formed to completely cover the first gate electrodes 121N and 121P on the entire surface of the substrate 110 by using a photolithography process (a third masking process).

In this embodiment, the case where the gate wiring having the dual structure of the low-resistance conductive material of the aluminum group and molybdenum is described, but the present invention is not limited thereto, and so long as the first gate wiring is made of a low-resistance material at a lower side and the second gate wiring that does not react to the developer and completely covers the first gate wiring is formed at an upper side thereof, any conductive material may be applicable as a material of the first gate wiring and the second gate wiring. In addition, the present invention may be applied to a structure of three or more layers besides the gate wiring with the dual layer structure.

Next, as shown in FIG. 2C, a low density n– impurity ion is doped on the entire surface of the substrate 110, on which the first gate electrodes 121N and 121P and the second gate electrodes 121'N and 121'P have been formed, to form n– doped regions 124N' and 124P' at the active patterns 124N and 124P of the N type TFT and the P type TFT.

The gate electrodes 121N, 121N', 121P and 121P' serve as masks, so that the n– doped regions 124N' and 124P' are formed at certain left and right regions, except the central regions 124NC and 124PC of the active patterns 124N and 124P covered by the gate electrodes 121N, 121N', 121P and 121P'. The channel region 124NC of the N type TFT and the channel region 124PC of the P type TFT are defined at the center of the active patterns 124N and 124P of the N type TFT and the P type TFT by the gate electrodes 121N, 121N', 121P and 121P'.

Figure 2D:
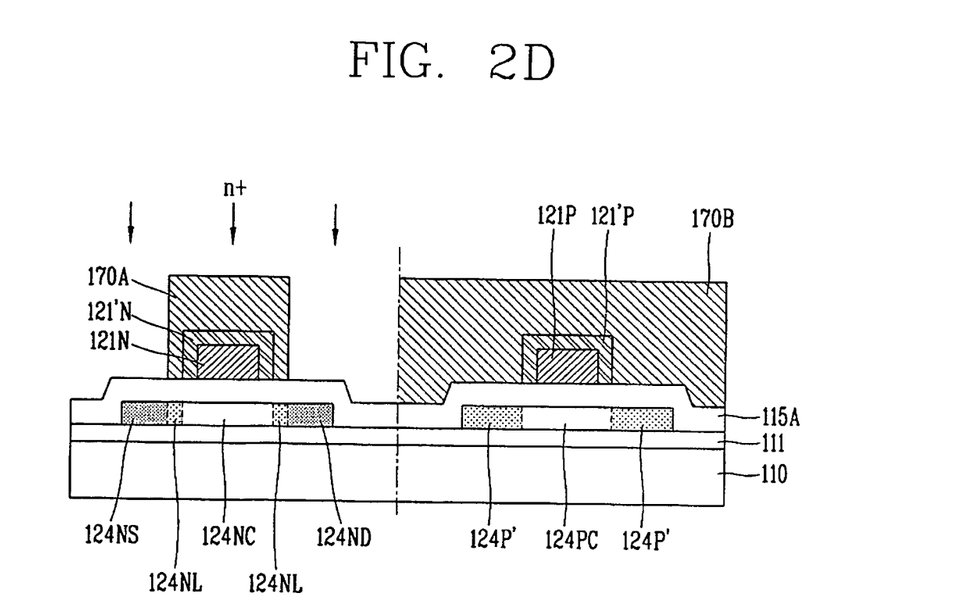

Thereafter, in order to fabricate the N type TFT (in order to form the N type source and drain electrodes at the active pattern 124N of the N type TFT), as shown in FIG. 2D, a portion of the N type TFT region and the entire P type TFT region are covered with photosensitive film patterns 170A and 170B (a fourth masking process) and an n+ impurity ion with high density is doped on the entire surface of the substrate 110.

Because the n+ impurity ion is injected into the N type portion of the TFT, namely, a certain region including the gate electrodes 121N and 121'N covered with the first photosensitive film pattern 170A, N type source and drain regions 124NS and 124ND, resistance contact layers, are formed in the region of the active pattern 124N of the N type TFT.

Between the source region 124NS and the drain region 124ND of the N type TFT, an LDD (Lightly Doped Drain) region 124NL, a channel region 124NC, and an LDD region 124NL are defined. Namely, the LDD region 124NL, n– doped region, of the N type TFT is defined between the source region 124NS and the channel region 124NC and between the drain region 124ND and the channel region 124NC. The LDD region 124NL serves to reduce a leakage current when the N type TFT is in an OFF state.

The gate electrodes 121N and 121'N and the first and the first photosensitive film pattern 170A of the N type TFT serve as an ion-stopper for preventing infiltration of a dopant into the channel region 124NC of the N type active pattern 124N.

The source region 124NS and the drain region 124ND of the N type TFT are formed by injecting a group-5 element such as phosphor (P) that can donate electrons.

Figure 2E:
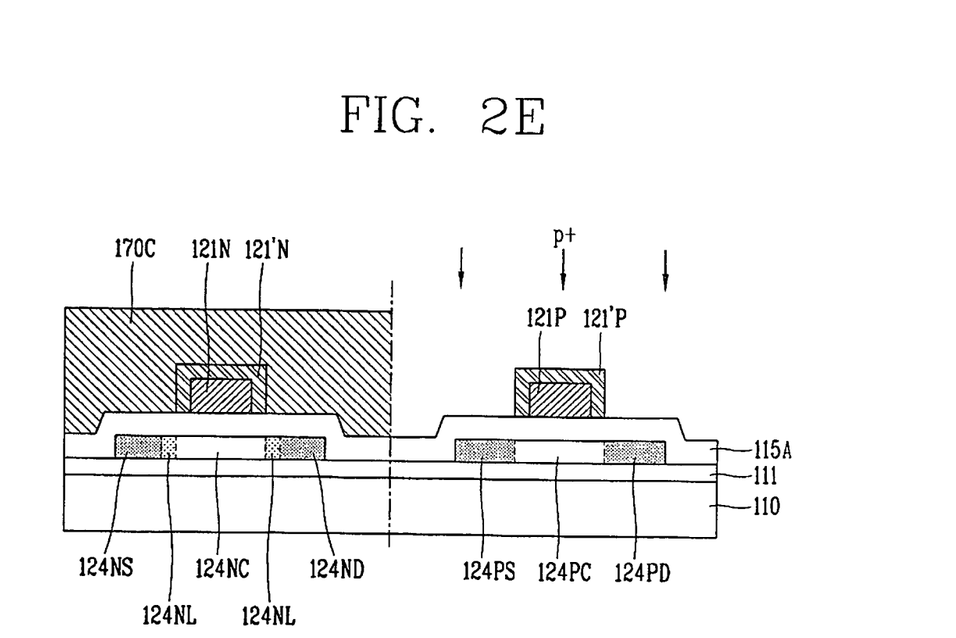

And as shown in FIG. 2E, the entire N type TFT region is covered with a third photosensitive film pattern 170 (a fifth masking process) and a high density p+ impurity ion is doped on the entire surface of the substrate 110 to form a P type source region 124PS and a drain region 124PD in certain regions of the active pattern 124P of P type TFT.

The n– doped regions 124P' of the P type TFT which have been formed by the n– doping process are changed to the p+ doped regions, namely, the P type source region 124PS and drain region 124PD through the high density p+ ion doping. In this case, the gate electrodes 121P and 121P' of the P type TFT serve as ion-stoppers preventing infiltration of the dopant into the channel region 124PC of the P type active pattern 124P.

At this time, the source and drain regions 124PS and the 124PD of the P type TFT are formed by injecting a group-3 element such as boron (B) that can donate a hole.

In this embodiment, the N type TFT is first fabricated by performing the N doping and then the P type TFT is fabricated by performing the P doping, and in this case, the process may be performed by changing the order of the N doping and P doping.

Figure 2F:
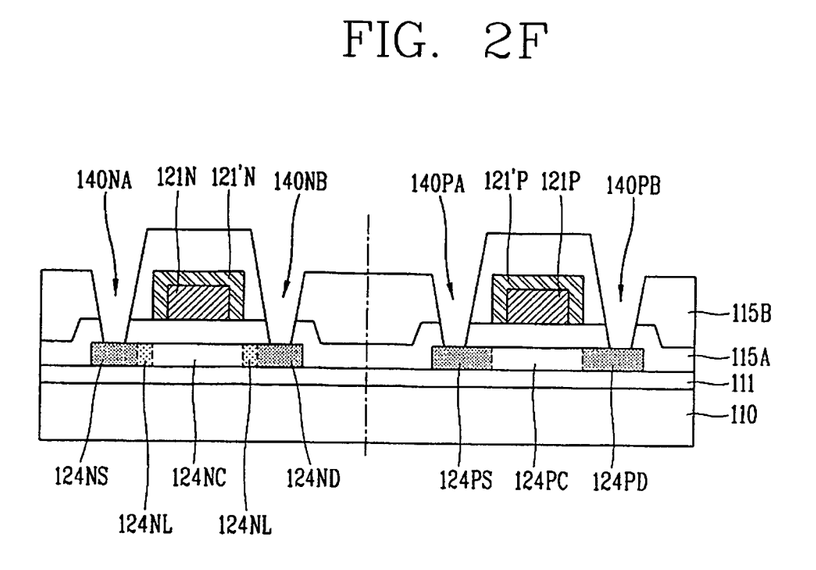

Thereafter, as shown in FIG. 2F, a second insulation film 115B, an interlayer insulation film, is formed on the entire surface of the substrate 110, and the second insulation film 115B and the first insulation film 115A are selectively patterned by using the photolithography process (a sixth masking process) in order to form a first contact hole 140NA exposing a portion of the source region 124NS and a second contact hole 140NB exposing a portion of the drain region 124ND of the N type TFT, and a third contact hole 140PA exposing a portion of the source region 124PS and a fourth contact hole 140PB exposing a portion of the drain region 124PD of the P type TFT.

The second insulation film 115B can be formed as an inorganic insulation film such as a silicon oxide film or a silicon nitride film, or may be formed as an organic insulation film formed of a benzocyclobutene (BCB) or acryl having low dielectric constant to obtain a high aperture ratio.

Figure 2G:
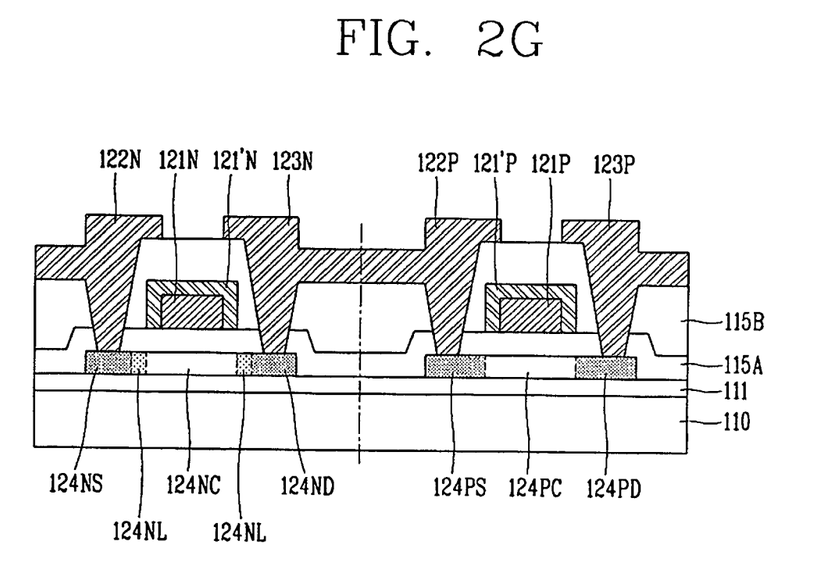

And then, as shown in FIG. 2G, a source electrode 122N electrically connected with the N type source region 124NS through the first contact hole 140NA and a drain electrode 123N electrically connected with the drain region 124ND through the second contact hole 140NB are formed at the N type TFT region, and a source electrode 122P electrically connected with the P type source region 124PS through the third contact hole 140PA and a drain electrode 123P electrically connected with the drain region 124PD through the fourth contact hole 140PB are formed at the P type TFT region through a photolithography process (a seventh masking process).

In the present invention, any low-resistance conductive material may be used for the first gate wiring so long as it has the second gate wiring over its upper portion that does not react with the developer and that covers the first gate wiring. In addition, the present invention may include a structure of three or more layers besides the gate wiring of the dual-layer structure.

In addition, the second gate wiring may have any form so long as it covers the first gate wiring to prevent exposure of the first gate wiring to the developer.

A second embodiment of the present invention in which the second gate wiring has a different structure from the first embodiment will be described as follows.

Figure 3:
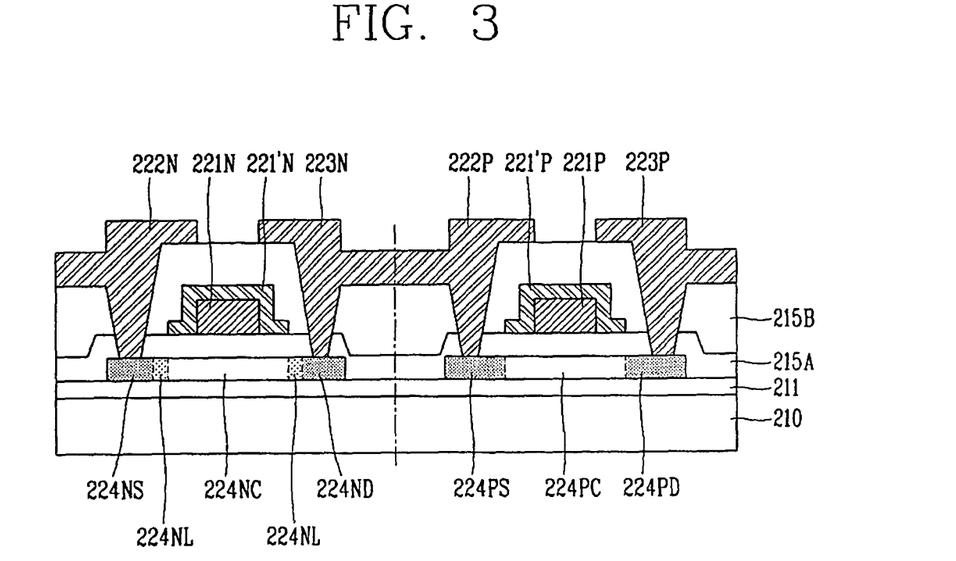
FIG. 3 is a sectional view showing a TFT in accordance with a second embodiment of the present invention.

FIG. 3 is a sectional view showing a TFT in accordance with the second embodiment of the present invention, in which the N type TFT is shown at the left side while the P type TFT is shown at the right side.

The TFT in accordance with the second embodiment of the present invention has the same construction as that of the first embodiment, except for the structure of the second gate electrode. Thus, only the different part will now be described and descriptions for the same features will be omitted.

As shown, N type and P type TFTs comprising an active pattern, gate electrodes 221N, 221'N, 221P, and 221'P and source and drain electrodes 222N, 222P, 223N, and 223P are formed on a substrate 210 with a buffer layer 211 formed thereon.

The active pattern of the N type TFT is divided into a source region 224NS, LDD regions 224NL, a channel region 224NC and a drain region 224ND, and the active pattern of the P type TFT is divided into a source region 224PS, a channel region 224PC and a drain region 224PD. This embodiment shows the case where the LDD region 224NL is formed in the active pattern of the N type TFT, the present invention is not limited thereto but may be applied to an N type TFT of a general structure where the LDD region is not defined.

The gate electrodes 221N, 221'N, 221P, and 221'P comprises low-resistance first gate electrodes 221N and 221P and second gate electrodes 221'N and 221'P which are formed of a conductive material and do not react to the developer. The second gate electrodes 221'N and 221'P are formed on the first gate electrodes 221N and 221P, covering the first gate electrodes 221N and 221P, to prevent the first gate electrodes 221N and 221P from being etched.

In particular, in this embodiment, the second gate electrodes 221'N and 221'P are formed such that portions of left and right ends protrude away from the first gate electrodes 221N and 221P.

Accordingly, in the LCD device in accordance with the first and second embodiments of the present invention, because the second gate electrodes are formed to completely cover the first gate electrodes using the conductive material that does not react to the developer, the first gate electrodes may be protected from the developer during the doping process.

In particular, because the gate wiring is formed of the low-resistance conductive material, a large-scale panel may be implemented, and in addition, because the conductive material such as molybdenum, titanium or chrome of the second gate electrode has thermal stability, it does not cause the formation of hillocks.

The array substrate is separated by cell gap uniformly maintained by spacers from a color filter substrate fabricated through a separate process, and then attached with the color filter substrate by the seal pattern formed at an outer edge of the pixel part, to thereby form a unit liquid crystal display panel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device comprising:
   providing a first substrate having a first region and a second region;
   forming an active pattern in the first and second regions of the first substrate, wherein each active pattern is divided into a first area at a central portion of the active pattern, a pair of second areas and a pair of third areas;
   forming a first insulation film on the first substrate including the active pattern;
   forming a first gate electrode with a low-resistance conductive material on only a portion of the first area of the active pattern with the first insulation film interposed therebetween;
   forming a second gate electrode which is formed of a conductive material including molybdenum or molybdenum alloy to entirely cover the first gate electrode on only the first area of the active pattern with the first insulation film interposed therebetween, wherein the first area of the active layer is non-doped;
   doping a low density n− impurity ion at the pair of second and third areas of the active pattern in the first and second regions of the first substrate using the first and second gate electrodes as a mask;
   forming a first photosensitive film pattern to cover the first and second gate electrodes of the first region of the first substrate and cover the entire second region of the first substrate;
   forming N type source and drain regions at the pair of third areas of the active pattern of the first region of the first substrate by doping an n+ impurity ion using the first photosensitive film pattern as a mask and then forming LDD (lightly doped drain) regions at the pair of second areas of the active pattern of the first region of the first substrate;
   forming a second photosensitive film pattern to cover the entire first region of the first substrate;
   forming P type source and drain regions at the pair of second and third areas of the active pattern of the second region of the first substrate by doping a p+ impurity ion using the second photosensitive film pattern as a mask;
   forming a second insulation film on the first substrate formed the first and second gate electrodes;
   forming N type source and drain electrodes electrically connected with the N type source and drain regions on the first region of the first substrate and forming P type source and drain electrodes electrically connected with the P type source and drain regions on the second region of the first substrate; and
   attaching the first and second substrates.

2. The method of claim 1, further comprising:
   forming a buffer layer formed of a silicon oxide film at the lowermost layer of the first substrate.

3. The method of claim 1, wherein the active pattern is formed of a polycrystalline silicon thin film.

4. The method of claim 1, wherein the first gate electrode is formed of a low-resistance conductive material including aluminum or aluminum alloy.

5. The method of claim 1, wherein the second gate electrode is formed to cover the first gate electrode to prevent exposure of the first gate electrode to a developer during a doping process.

6. The method of claim 1, wherein the second gate electrode includes protruding left and right end portions.

7. The method of claim 1, further including:
   removing a portion of the second and first insulation films after the second insulation form is formed, and forming a first contact hole exposing a portion of the N type source region and a second contact hole exposing a portion of the drain region of the first region, and a third contact hole exposing a portion of the P type source region, and a fourth contact hole exposing a portion of the drain region.

8. The method of claim 7, wherein the N type source region and source electrode are electrically connected through the first contact hole, the N type drain region and drain electrode are electrically connected through the second contact hole, the P type source region and source electrode are electrically connected through the third contact hole, and the P type drain region and drain electrode are electrically connected through the fourth contact hole.

9. A method of for fabricating a liquid crystal display device comprising:
   providing a first substrate including a pixel portion and a driving circuit portion having first and second regions;
   forming an active pattern on the pixel portion and the driving circuit portion of the first substrate, wherein each active pattern is divided into a first area at a central portion of the active pattern, a pair of second areas and a pair of third areas;

forming a first insulation film on the first substrate including the active pattern;

forming a first gate electrode with a low-resistance conductive material on only a portion of the first area of the active pattern with the first insulation film interposed therebetween;

forming a second gate electrode which is formed of a conductive material including molybdenum or molybdenum alloy to entirely cover the first gate electrode on only the first area of the active pattern with the first insulation film interposed therebetween, wherein the first area of the active layer is non-doped;

doping a low density n− impurity ion at the pair of second and third areas of the active pattern in the pixel portion and the first region of the driving circuit portion of the first substrate using the first and second gate electrodes as a mask;

forming a first photosensitive film pattern to cover the first and second gate electrodes of the pixel portion of the first substrate and the first region of the driving circuit portion and cover the entire second region of the driving circuit portion of the first substrate;

forming N type source and drain regions at the pair of third areas of the active pattern of the pixel portion of the first substrate and the active pattern of the first region of the driving circuit portion of the first substrate by doping an n+ impurity ion using the first photosensitive film pattern as a mask and then forming LDD regions at the pair of second areas of the active pattern of the first region of the pixel portion of the first substrate and the active pattern of the first region of the driving circuit portion of first substrate;

forming a second photosensitive film pattern to cover the entire pixel portion of the first substrate and the entire first region of the driving circuit portion of the first substrate;

forming P type source and drain regions at the pair of second and third areas of the active pattern of the second region of the driving circuit portion of the first substrate by doping a p+ type impurity ion using the second photosensitive film pattern as a mask;

forming a second insulation film on the first substrate formed the first and second gate electrodes;

forming N type source and drain electrodes electrically connected with the N type source and drain regions at the pixel portion of the first substrate and the first region of the driving circuit portion of the first substrate and forming P type source and drain electrodes electrically connected with the P type source and drain regions at the second region of the driving circuit portion of the first substrate; and attaching the first substrate and a second substrate.

10. The method of claim 9, wherein the first gate electrode is formed of a low-resistance conductive material including aluminum or aluminum alloy.

11. The method of claim 9, wherein the second gate electrode is formed to cover the first gate electrode so that the first gate electrode is not exposed to a developer during a doping process.

12. The method of claim 9, wherein the second gate electrode has protruding left and right end portions.

* * * * *